(12) United States Patent
Baumgartner et al.

(10) Patent No.: US 8,037,085 B2
(45) Date of Patent: Oct. 11, 2011

(54) PREDICATE SELECTION IN BIT-LEVEL COMPOSITIONAL TRANSFORMATIONS

(75) Inventors: Jason R. Baumgartner, Austin, TX (US); Hari Mony, Austin, TX (US); Viresh Paruthi, Austin, TX (US); Fadi Z. Zaraket, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 555 days.

(21) Appl. No.: 12/129,976

(22) Filed: May 30, 2008

(65) Prior Publication Data

US 2008/0228694 A1    Sep. 18, 2008

Related U.S. Application Data

(63) Continuation of application No. 11/333,606, filed on Jan. 17, 2006, now abandoned.

(51) Int. Cl.
  G06F 7/00   (2006.01)
  G06F 17/30  (2006.01)

(52) U.S. Cl. .......... 707/761; 707/764; 707/770; 716/51; 716/106; 716/111

(58) Field of Classification Search ................ 707/761, 707/770, 764; 716/4, 5, 51, 106, 111
See application file for complete search history.

(56) References Cited

U.S. PATENT DOCUMENTS

| | | | | |
|---|---|---|---|---|
| 6,163,876 A * | 12/2000 | Ashar et al. | 716/5 |
| 6,816,825 B1 * | 11/2004 | Ashar et al. | 716/106 |
| 6,874,135 B2 * | 3/2005 | Gupta et al. | 716/108 |
| 6,944,838 B2 * | 9/2005 | McMillan | 716/5 |
| 7,065,726 B1 * | 6/2006 | Singhal et al. | 716/5 |
| 7,149,987 B2 * | 12/2006 | Zhu et al. | 716/4 |
| 7,380,222 B2 * | 5/2008 | Baumgartner et al. | 716/2 |
| 7,437,690 B2 * | 10/2008 | Baumgartner et al. | 716/2 |
| 7,653,884 B2 * | 1/2010 | Furnish et al. | 716/103 |
| 7,921,393 B2 * | 4/2011 | Furnish et al. | 716/110 |
| 2005/0198597 A1 * | 9/2005 | Zhu et al. | 716/4 |
| 2006/0117274 A1 * | 6/2006 | Tseng et al. | 716/1 |
| 2008/0270086 A1 * | 10/2008 | Baumgartner et al. | 703/1 |

OTHER PUBLICATIONS

Zaraket et al.—"Scalable Compositional Minimization via Static Analysis"—2005 IEEE—Computer-Aided Design, 2005, ICCAD-2005, IEEE/ACM International Conference, Nov. 6-10, 2005, (pp. 1057-1067).*

(Continued)

*Primary Examiner* — John E Breene
*Assistant Examiner* — Anh Ly
(74) *Attorney, Agent, or Firm* — Dillon & Yudell LLP

(57) ABSTRACT

A method for performing verification includes selecting a first set containing a seed register and adding to a second set a result of a subtraction of a fanout of the first set from a fanin of the first set. A third set is rendered equal to a result of a subtraction of a fanin of the second set from a fanout of the second set, and whether a combination of the first set and the third set is equivalent to the first set is determined. In response to determining that the combination of the first set and the second set is not equivalent to the first set, a min-cut of the first set and the second set containing a minimal set of predicates between a first component and the logic to which the component fans out, wherein the logic is bordered by the second set is returned.

20 Claims, 5 Drawing Sheets

OTHER PUBLICATIONS

Dong Wang & Jeremy Levitt—"Automatic assume guarantee analysis for assertion-based formal verification"—ASP-DAC 2005, 2005 IEEE (ASP-DAC '05 Proceedings of the 2005 Asia and South pacific Design Automation conference (pp. 561-566).*

Miroslav N. Velev—"Exploiting signal unobservability for efficient translation to CNF in formal verification of microprocessors"—Proceedings of the design, automation and test in Europe conference and exhibition (DATE'04) Mar. 8, 2004 IEEE (pp. 1-6).*

Tiziana Margaria—"Fully automatic verfication and error detection for parameterized iterative sequential circuits"—Computer Science, 1996, vol. 1055/1996 (pp. 258-277).*

* cited by examiner

PREDICATE SELECTION IN BIT-LEVEL COMPOSITIONAL TRANSFORMATIONS

This application is a continuation of U.S. patent application Ser. No. 11/333,606, filed on Jan. 17, 2006 now abandoned, entitled "Method and System for Predicate Selection in Bit-Level Compositional Transformations" which is co-related to U.S. patent application Ser. No. 11/249,937, filed on Oct. 13, 2005, and issued on Oct. 14, 2008, as U.S. Pat. No. 7,437,690, and entitled, "METHOD FOR PREDICATE-BASED COMPOSITIONAL MINIMIZATION IN A VERIFICATION ENVIRONMENT", the contents of which are incorporated herein by reference.

BACKGROUND OF THE INVENTION

1. Field of the Invention

The present invention relates in general to verifying designs and in particular to reducing resource requirements during verification. Still more particularly, the present invention relates to a system, method and computer program product for predicate selection in bit-level compositional transformations.

2. Description of the Related Art

With the increasing penetration of microprocessor-based systems into every facet of human activity, demands have increased on the microprocessor development and production community to produce systems that are free from data corruption. Microprocessors have become involved in the performance of a vast array of critical functions, and the involvement of microprocessors in the important tasks of daily life has heightened the expectation of reliability of calculative results. Whether the impact of errors would be measured in human lives or in mere dollars and cents, consumers of microprocessors have lost tolerance for error-prone results. Consumers will not tolerate, by way of example, miscalculations on the floor of the stock exchange, in the medical devices that support human life, or in the computers that control their automobiles. All of these activities represent areas where the need for reliable microprocessor results has risen to a mission-critical concern.

Formal and semiformal verification techniques provide powerful tools for discovering errors in verifying the correctness of logic designs. Formal and semiformal verification techniques frequently expose probabilistically uncommon scenarios that may result in a functional design failure. Frequently, formal and semiformal verification techniques provide the opportunity to prove that a design is correct (i.e., that no failing scenario exists).

Unfortunately, formal verification techniques require computational resources which are exponential with respect to the size of the design under test. In particular, many formal analysis techniques require exponential resources with respect to the number of state elements in the design under test. Semiformal verification techniques leverage formal methods on larger designs by applying them only in a resource-bounded manner, though at the expense of incomplete verification coverage; generally, coverage decreases as design size increases.

Numerous approaches have thus been proposed to reduce the complexity of a design under verification. For example, bisimulation minimization techniques seek to iteratively collapse equivalent states from the design's state transition representation. While such techniques may yield large reductions in state space, they address a PSPACE-complete problem, and the resulting resource cost may outweigh the savings by the verification framework, when compared to methods such as such as symbolic invariant checking.

Predicate abstraction techniques build an overapproximate abstraction of the design under verification. These approaches first select a set of predicates of the original design, then compute the set of possible transitions between predicate valuations, using the result as the abstracted transition system. This overapproximation often results in spurious property failures, requiring a refinement step which increases the number of predicates in the abstracted system to tighten the overapproximation. For larger control-intensive netlists, the number of refinement steps may become exorbitant. Furthermore, the abstracted system may exceed the complexity of the original netlist because it uses predicates as variables, which may exceed the number of original state and input variables, often degrading to an inconclusive result.

Unfortunately, netlist transformation and abstraction techniques operate on predicates detected at word-level representations. Predicates selected at word-level limit prior-art transformations and do not allow them to detect automatically generated (non-word-level) predicates of good quality. Word-level predicates also limit the ability to iteratively and synergistically apply these transformations under a transformation-based verification framework. What is needed is a method, system and computer program product for predicate selection that operates on bit-level netlists to provide high quality predicates for compositional processing.

SUMMARY OF THE INVENTION

A method for performing verification includes selecting a first set containing a seed register and adding to a second set a result of a subtraction of a fanout of the first set from a fanin of the first set. A third set is rendered equal to a result of a subtraction of a fanin of the second set from a fanout of the second set, and whether a combination of the first set and the third set is equivalent to the first set is determined. In response to determining that the combination of the first set and the second set is not equivalent to the first set, a min-cut of the first set and the second set containing a minimal set of predicates between a first component and the logic to which the component fans out, wherein the logic is bordered by the second set is returned.

BRIEF DESCRIPTION OF THE DRAWINGS

The present invention is described in a preferred embodiment in the following description with reference to the drawings, in which like numbers represent the same or similar elements, as follows.

DETAILED DESCRIPTION OF A PREFERRED EMBODIMENT

The present invention provides method, system and computer program product for predicate selection that operate on bit-level netlists to provide high quality predicates for compositional processing. The present invention improves the quality of a predicate component in terms of the relationship between the component's set of outputs ($V_c$), which should be significantly smaller in cardinality than its set of pseudo-inputs ($V_c$bar). The present invention facilitates the creation of components in a netlist that constitute cuts in the netlist with pseudo-input sets that are subsets of all original registers and inputs and register sets that are subsets of all registers. The outputs of each component are a set of arbitrary vertices in the netlist that are functions of the component registers. The present invention identifies a subset of registers that highly depend on each other and then computes a combinational min-cut with these registers as sources and other interesting vertices in the netlist, such as next state functions, as sinks. The present invention then applies a 'threshold of cardinality' to check the vertices returned by the min-cut versus the registers and inputs in their fan-in.

Though the present invention is useful in a variety of contexts, one example of a use of the present invention is application to a method, system, and computer program product for automated abstraction of netlists through bisimulation detection. The present invention facilitates the ability of a verification environment to more efficiently utilize a linear-time partitioning method to automatically isolate a component of a bit-level netlist graph, whose outputs represent an adequate set of predicates against which to preserve its behavior, to subsequently determine the equivalence-class of the states of the component which are bisimilar with respect to its predicates, and finally to determine the equivalence-class of its input space under transitions to bisimilar state sets. Such a system next synthesizes this input equivalence class into the design, to restrict the component's visibility of the original input space to equivalence class representatives thereof. Synergistic transformations such as sequential redundancy removal are used to propagate the reductions enabled by this input restriction through the netlist.

Figure 1:
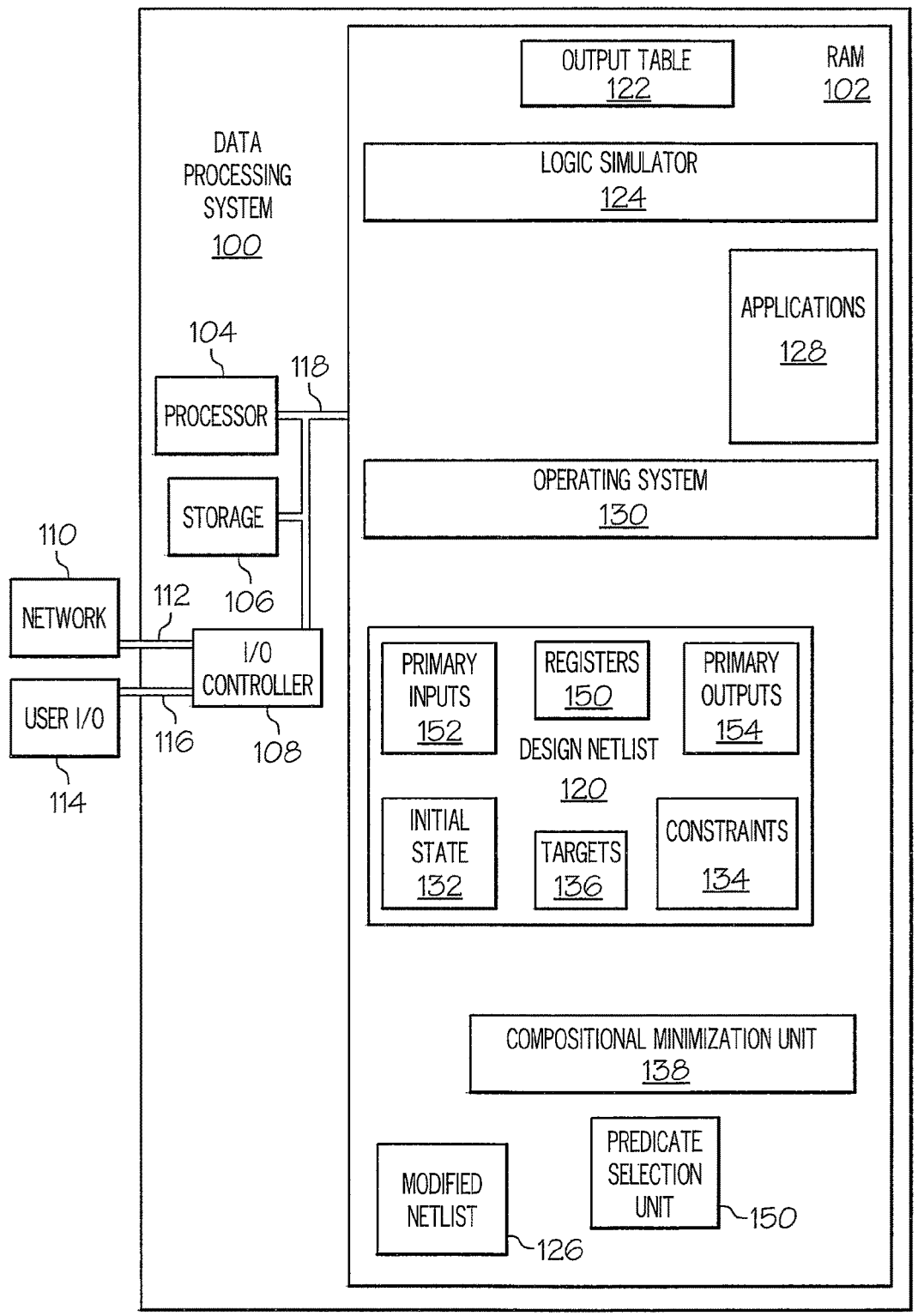
FIG. 1 illustrates a block diagram of a general-purpose data processing system with which the present invention of a method, system and computer program product for predicateselection in bit level compositional transformations may be performed.

With reference now to the figures, and in particular with reference to FIG. 1, a block diagram of a machine, such as a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention, including a design netlist 120 and an output table 122 for interaction with a logic simulator 124. Other applications 128 and logic simulator 124 interface with processor 104, RAM 102, I/O control 108, and storage 106 through operating system 130. Other data structures in RAM 102 include a modified netlist 126, a compositional minimization module 138 and a predicate selection unit 160. One skilled in the data processing arts will quickly realize that additional components of data processing system 100 may be added to or substituted for those shown without departing from the scope of the present invention.

A netlist graph, such as design netlist 120, is a popular means of compactly representing circuit structures in computer-aided design of digital circuits. Such a representation is non-canonical and offers limited ability to analyze the function from the nodes in the graph. Design netlist 120 contains a directed graph with vertices representing gates and edges representing interconnections between those gates. The gates have associated functions, such as constraints 134, targets 136, inputs 152, outputs 154, combinational logic (e.g., AND gates), and sequential elements (hereafter referred to as registers 150). Registers 150 have two associated components; their next-state functions and their initial-value functions, which are represented as other gates in the graph or as an initial state data structure 132. Semantically, for a given register 150, the value appearing at its initial-value gate at time "0" ("initialization" or "reset" time) will be applied as the value of the register itself; the value appearing at its next-state function gate at time "i" will be applied to the register itself at time "i+1".

Processor 104 executes instructions from programs, often stored in RAM 102, in the course of performing the present invention. In a preferred embodiment of the present invention, processor 104 executes logic simulator 124. Logic simulator 124 performs testing operations on design netlist 120. Logic simulator 124 includes a computer program product, stored in RAM 102 and executed on processor 104, which provides a series of tools for activities such as equivalence checking, property checking, logic synthesis and false-paths analysis. Generally speaking, logic simulator 124 contains rule-based instructions for predicting the behavior of logically modeled items of hardware.

Targets 136 represent nodes whose Boolean expressions are of interest and need to be computed. The goal of the verification process is to find a way to drive a '1' on a target 136 node, or to prove that no such assertion of the target 136 is possible. In the former case, a "counterexample trace" showing the sequence of assignments to the inputs in every cycle leading up to the failure event is generated and recorded to output table 122.

Logic simulator 124 uses the series of rules contained in its own instructions, in conjunction with design netlist 120, to represent the underlying logical problem structurally (as a circuit graph), and includes a Cycle-Based Symbolic Simulator (CBSS), which performs a cycle-by-cycle simulation on design netlist 120 symbolically by applying unique random, or non-deterministic, variables to the design netlist 120 inputs 152 in every cycle.

At each step of the simulation, the Boolean expressions of the target 136 nodes are tested for assertion of a value of '1'. If so, a counterexample trace leading up to the failure (represented by the assertion of the target 136 node to a '1') is returned to output table 122. Constraints 134 are factored in before this check for the targets 136 being hit is performed. This factoring is typically accomplished by simply ANDing the Boolean expression for the target 136 with the Boolean expression for each of the constraints 134.

If unsolved targets 136 remain, then the registers 150 are updated with the values of the next-state functions, and the process continues.

Figure 2:
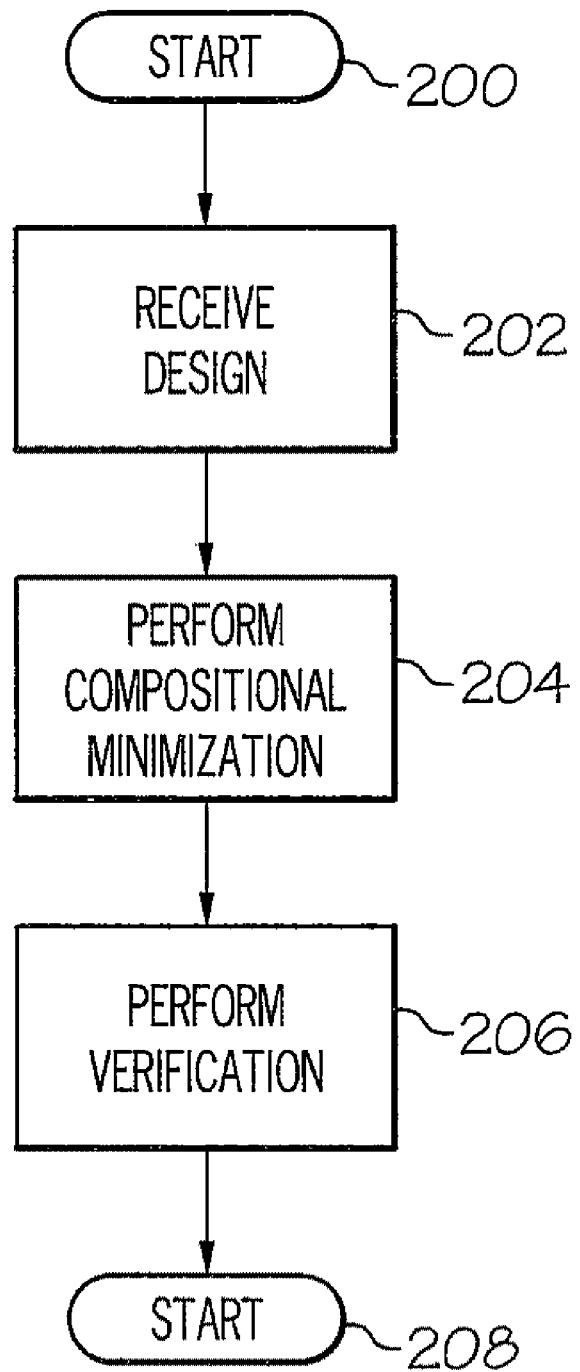
FIG. 2 is a high-level logical flowchart of a process for performing verification in accordance with preferred embodiment of the present invention.

Turning now to FIG. 2, a high-level logical flow chart of a process for performing verification of a design in accordance with a preferred embodiment of the present invention is illustrated. The process starts at step 200. The process then proceeds to step 202, which depicts logic simulator 124 receiving a design in the form of design netlist 120. The process then moves to step 204. At step 204, compositional minimization module 138 performs compositional minimization according to the method described with respect to FIG. 3. The process next moves to step 206, which illustrates logic simulator 124 performing verification of design netlist 120. The process then ends at step 208.

Compositional minimization module 138 identifies bisimilar states within design netlist 120 and copes with the intractability of traditional bisimulation computation in two ways. First, compositional minimization module 138 underapproximates the identified set of bisimilar states within design netlist 120 by identifying subsets of those states within design netlist 120 which are bisimilar under a selected set of predicate labels. Second, compositional minimization module 138 employs preimage computation. With the employment by compositional minimization module 138 of efficient symbolic methods, preimage computation may be performed via static analysis, addressing a problem in NP-space. The resulting underapproximation identifies the majority of truly equivalent states in certain design netlist 120 and thereby enables reductions that go qualitatively beyond related techniques such as retiming and resynthesis and datapath reductions.

Compositional minimization module 138 abstracts individual components of design netlist 120 to avoid the complexity of analyzing the entire system.

Compositional minimization module 138 injects a combinational filter onto the inputs of a component of design netlist 120 to restrict its visibility of the original input 152 space to a selected representative from each of the equivalence classes thereof. To obtain significant reductions of the resulting modified netlist 126, compositional minimization module 138 exploits other synergistic transformations such as sequential redundancy removal which, though addressing a PSPACE-complete problem, often trade reductions of optimality for computational efficiency.

Compositional minimization module 138 thereby performs minimal structural modifications to design netlist 120 to enable its reductions, avoiding the costly sequential re-encoding techniques used by prior-art state minimization approaches for synthesis or bisimulation minimization, which in many cases actually increase the complexity of the design being re-encoded. Compositional minimization module 138 thereby also uniquely trivializes the problem of counterexample trace lifting.

A function used by compositional minimization module 138 to perform the required abstractions can be represented as pseudocode as follows:

| Function_ComputeInputEquivalence(N): | | |
|---|---|---|
| $E_q$ | $= \bigwedge_{j=1}^{|Q|}(q_j = l_j);$ | // support: Q,R |
| $E_T$ | $= \exists I. \bigwedge_{j=1}^{|R|}(\hat{r}_j = f_j);$ | // $\hat{R}$, R |
| $E_{qT}$ | $= E_q \wedge E_T;$ | // Q,R,$\hat{R}$ |
| PreImg | $= (E_{qT}|_{r_j=r_j'})|_{r_j''=(r_j'=f_j)};$ | // Q,R,R',$\hat{R}$,I |
| PreImg$^a$ | $= \text{project}((\hat{R} \cup Q), \text{PreImg})|_{i_j=i_j'};$ | // Q,R,R',$\hat{R}$,I' |

| Function_ComputeInputEquivalence(N): | | |
|---|---|---|
| $I_T$ | $= \exists Q,\hat{R},R'.(\text{PreImg} \wedge \text{PreImg}^a);$ | // R,I,I' |
| return $I_T$; | | |

Compositional minimization module 138 uses the Function_ComputeInputEquivalence(N) described above to efficiently perform abstraction symbolically on design netlist 120. Given design netlist 120, compositional minimization module uses variables $Q = <q_1, \ldots, q_m>$ to capture valuations to selected predicates, whose functions over the inputs 152 and registers 150 in their combinational fanin is denoted as $L = <l_1, \ldots, l_m>$. Similarly, present-state register 150 variables are denoted as $R = <r_1, \ldots, r_n>$, whose next-state functions are denoted $F = <f_1, \ldots, f_n>$. Set $E_T$ represents image-equivalent states as a relation over variables R and R-hat, using R-hat as temporary register 150 variables to represent the selected equivalence class. $E_{qT}$ represents the output and image equivalent (OIE) states, and PreImg reflects states and input 152 valuations that transition to these OIE states.

Compositional minimization module 138 contains a function project, which is based upon a compatible projection operator that is used to symbolically map equivalence classes to representatives thereof. Compositional minimization module 138 utilizes project to collapse PreImg down to representatives over R-hat and Q variables, to equivalence-class transitions from present states (over R) to bisimilar next-state representatives (over R-hat and Q). Compositional minimization module 138 additionally maps input variables ij to i'j in PreImg^, so that the conjunction of PreImg^ and PreImg represents equivalence classes of input 152 valuations (over i) and representatives thereof (over i') between transitions from present states (over R) to bisimilar next-states (over R-hat and Q). Quantifying Q and R-hat from the resulting conjunction forms our equivalence relation I_T between original and abstracted inputs on a per-state basis, where (s,i,i') belongs to I_T implies that input stimulus i' may be mapped to i' in state while preserving bisimilarity.

Figure 3:
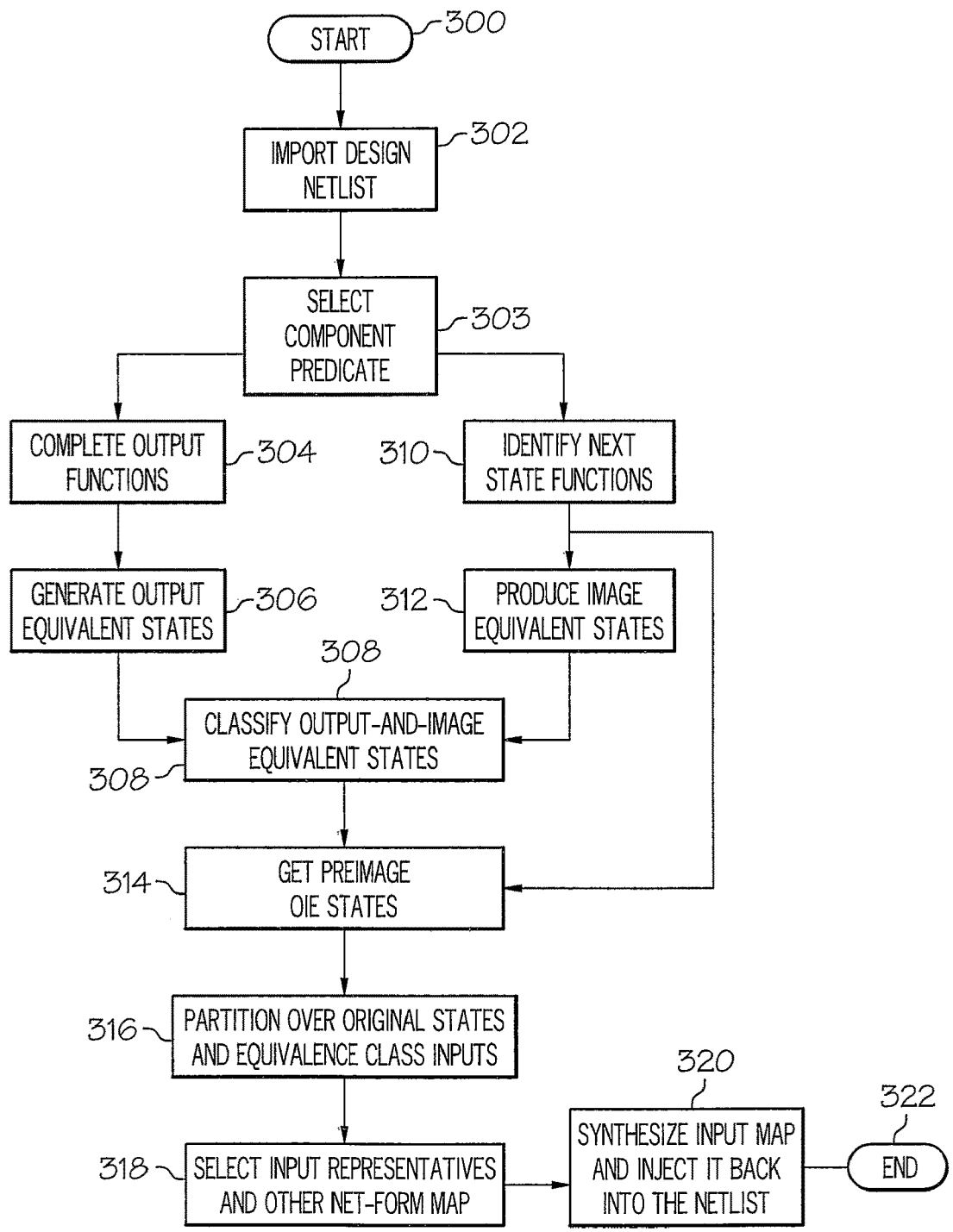
FIG. 3 is a high-level logical flowchart of a process for predicate-based compositional minimization, in accordance with the preferred embodiment of the present invention.

Referring now to FIG. 3, a flow diagram of a process for predicate-based compositional minimization, in accordance with the preferred embodiment of the present invention is depicted. The process starts at step 300, and then proceeds to step 302, which depicts logic simulator 124 importing design netlist 120. The process then moves to step 303. Step 303 illustrates logic simulator 124 selecting component predicate for minimization as described in FIG. 4. The process next moves in parallel along two paths, one through steps 304 and 306 to step 308, and another through step 310, followed by step 312 to step 308 or by step 314. At step 304, logic simulator 124 computes output 154 functions. The process then proceeds to step 306, which depicts logic simulator 124 generating output 154 equivalent states, listed as $E_q$ in Function_ComputeInputEquivalence(N).

Returning to step 303, and moving along the parallel path through step 310, the process then next moves to step 310, which illustrates logic simulator 124 identifying next state functions. The process then proceeds in parallel to step 312 and 314. At step 314, compositional minimization module 138 gets a preimage of OIE states, while, at step 312, compositional minimization module 138 produces image equivalent states $E_{t'}$. The process next moves to step 308. At step 308, compositional minimization module 138 classifies output-and-image equivalent states listed as $E_{qt}$ in Function_ComputeInputEquivalence(N). The process then converges to step 314, which is described above, and moves to step 316, which illustrates compositional minimization module 138 performing a partition over original states and equivalent class inputs 152. The process next moves to state 318, which depicts compositional minimization module 138 selecting input 152 representatives and forming an input 152 map, listed as $I_r$ in Function_ComputeInputEquivalence(N). The process then moves to step 320. At step 320, compositional minimization module 138 synthesizes the input 152 map generated in step 318 and injects the input 152 map generated in step 318 back into design netlist 120 to generate modified netlist 126.

Predicate selection unit 160 performs predicate selection in bit-level compositional transformations for compositional minimization module 138. Predicate selection unit 160 identifies a high-quality component containing a seed register (r) 150 according to a method embodied in the algorithm provided below:

---
Function: select_predicate:

$\hat{A}_0 = \{r\}$; $B_0 = \emptyset$;
for (j = 0 ; (j = 0) ∨ ($\hat{A}_j \neq \hat{A}_{j-1}$) ; j++)
   $B_{j+1} = B_j \cup \text{fanout}(\hat{A}_j)$;
   $\hat{A}_{j+1} = \hat{A}_j \cup \text{fanin}(B_{j+1})$;
$\hat{B} = B_j$; $\hat{A} = \hat{A}_j$;
if($\hat{A} \cap \hat{B} \equiv \emptyset$) return s-t mincut($\hat{A},\hat{B}$);
$A_0 = \{r\}$; $B_0 = \emptyset$;
for (j = 0 ; (j = 0) ∨ ($A_j \neq A_{j-1}$) ; j++)
   $B_{j+1} = B_j \cup \{\text{fanout}(A_j) \setminus \text{fanin}(A_j)\}$;
   $A_{j+1} = A_j \cup \{\text{fanin}(B_{j+1}) \setminus \text{fanout}(B_{j+1})\}$;
$A = A_j$; $B = B_j$;
return s-t mincut(A,B);
---

Within predicate selection unit 160, a function fanin(x) returns the set of registers 150 in the combinational fanin of the nextstate function of x, and fanout(x) returns the set of registers 150 and formula signals in the combinational fanout of x. A corresponding component is defined by the computation of minimally-sized register 150 boundaries A including register (r) 150 and B, where A is a superset of all registers 150 in the combinational fanin of the next-state functions of B, and B is a superset of all registers 150 in the combinational fanout of A. Predicate selection unit 160 computes a combinational min-cut between A and B, such that a set of cut gates $V_c$ represents the outputs of the selected component. The use of min-cut by predicate selection unit 160 represents an attempt to find a minimal set of predicates between a component (containing only registers 150 in A) and the logic that this component fans out to (containing registers 150 B). Once computed, if the resulting cut yields $|V_c|$ substantially smaller than $|A|$, predicate selection unit 160 records the component as a good candidate.

Predicate selection unit 160 is explained with respect to the method described in the foregoing algorithm using two fixed-point computations for clarity of exposition; practically, the second subsumes the first. The first fixed-point calculation by predicate selection unit 160 approximates A and B as sets A_hat and B_hat, respectively. As an example, consider the application of the method embodied by the algorithm described above by predicate selection unit 160 on a netlist, relative to a seed li from l. Initially, predicate selection unit 160 will obtain A_hat_0={l_i}, and B_hat_1={m}. On the next iteration, predicate selection unit 160 will obtain A_hat_1={l_i,m}, because both l and m are in the combinational fanin of B_hat_1. Predicate selection unit 160 thus obtains B_hat_2={m,n}, due to the addition of m to A_hat_1. This is likely to be a suboptimal result, because predicate selection unit 160 has grouped l and m into the same component, whereas it is preferable to identify the component containing only registers (l) 150 relative to predicates in their combinational fanout. Reduction of the component containing only registers (m) 150 relative to predicates in their combinational fanout, which may in turn create even higher-quality predicates, is also desired. This sub-optimality motivates the second fixed-point calculation by predicate selection unit 160.

The cause of the prior sub-optimality was that duplicate elements were obtained between A_hat and B_hat. The second loop by predicate selection unit 160 enforces disjointness by preventing the addition of registers 150 in self-loops involving A into B, and vice-versa. Returning to the example described above, the second loop by predicate selection unit 160 will ensure that A_1={i}. Note that m will not be added to A_1 due to these restrictions, and the performed by predicate selection unit 160 process will terminate with A={1} and B={m}, as desired. Because |B|=m, there exists a min-cut of cardinality at most m, which is significantly smaller than |A|=1, making this a good candidate.

To further illustrate the method employed by predicate selection unit 160, it is useful to consider other possible seeds. Each seed k_i of k will have only a single l_i in its combinational fanout; hence A and B will have cardinality 1, as will $V_c$. Predicate selection unit 160 will thus neglect considering these as candidates. Next consider a seed m_i from m. Predicate selection unit 160 will have A_hat_0={m_i}, and B_hat_1={m,n}; then A_hat_1={l,m} and B_hat_2={m, n}. The second fixed-point calculation by predicate selection unit 160 will prevent m from becoming part of B_1={n}, in turn preventing 1 from becoming part of A_I={m}. Because |B|=3, there exists a min-cut of cardinality at most 3, which is significantly smaller than |A|=6, making this a good candidate.

Predicate selection unit 160 selects seeds by iteratively applying the method embodied in the algorithm above to every register 150 in design netlist 120 that has not already been considered as an element of A. Note that the order in which seeds are considered by predicate selection unit 160 does not alter the resulting components. Unlike the resource-intensive circuit partitioning algorithms for synthesis, predicate selection unit 160 extracts components to minimize $V_c$ with no regard for $V_c$ bar due to the nature of the targeted transformations. Predicate selection unit 160 thus restricts analysis to combinational logic slices. Note that the overall component selection process may readily be tuned to run in linear time, noting the following: (1) No gate needs to be considered as an element of A twice, nor as an element of B twice. (2) Relative to a given seed, predicate selection unit 160 only need to traverse each gate twice fanout-wise and twice fanin-wise. (3) While min-cut algorithms cannot be guaranteed to yield linear complexity bounds even on graphs without directed cycles, predicate selection unit 160 may ensure linearity with minimal sacrifice in optimality. To ensure linearity with minimal sacrifice in optimality, predicate selection unit 160 uses an augmenting-path algorithm, which yields linear run-times on many netlists. A linear overall run-time may be further guaranteed by bounding the number of iterations of the augmenting-path algorithm; if prematurely terminated, this algorithm still offers a high-quality cut (though one which may be slightly suboptimal).

Predicate selection unit 160 efficiently detects cuts which correlate to word-level predicates of the design netlist 120 (e.g., a vector equality check X==Y), while operating solely upon the bit-level netlist. In many cases, predicate selection unit 160 finds significantly better predicates due to its ability to coalesce bit-level control nets into high-quality predicates.

This bit-level operation by predicate selection unit 160 requires negligible resources even on large netlists, while offering the unique benefits mentioned above. Consequently, predicate selection unit 160 has not caused the loss of word-level predicates in the bit-level netlist to be of any significance to achieve powerful predicate-based reductions.

Figure 4:
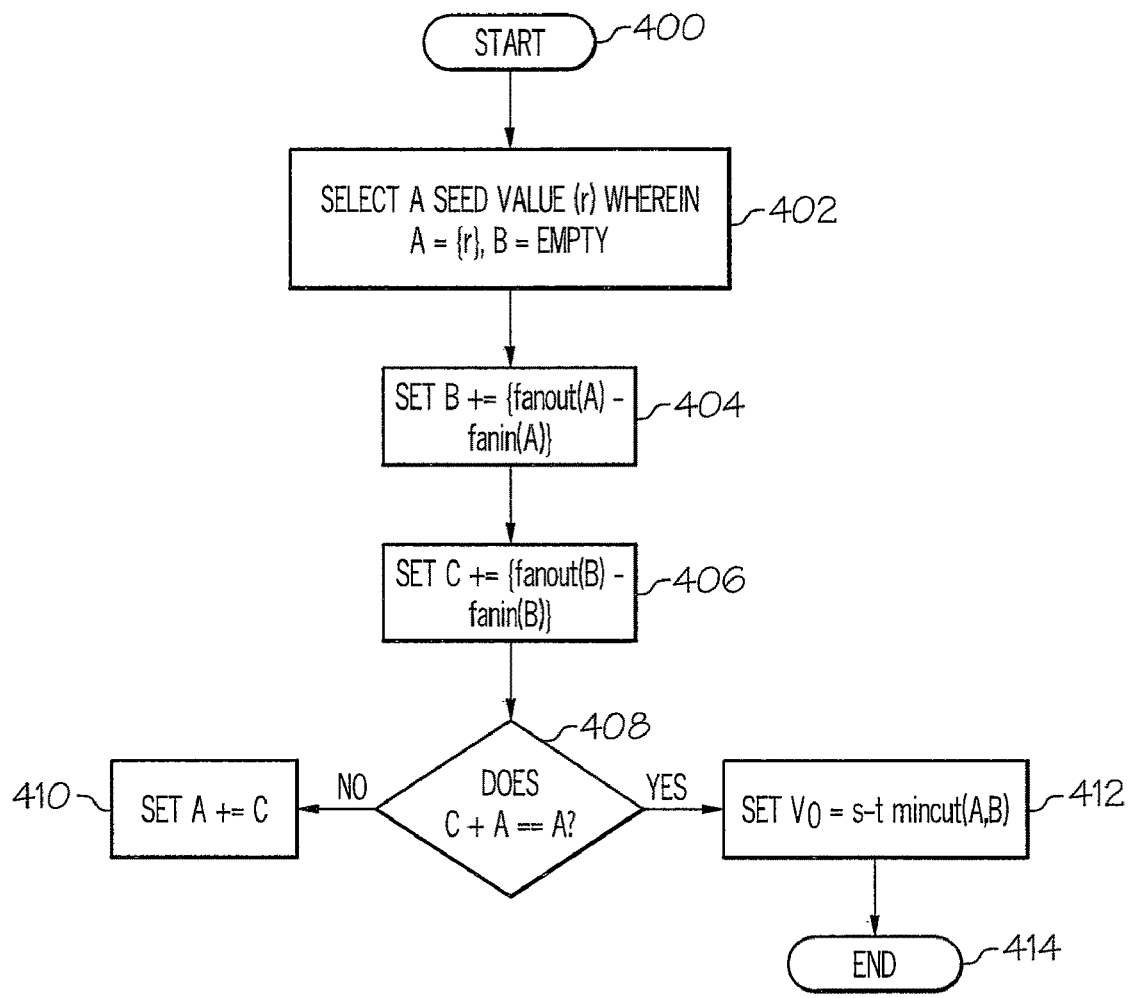
FIG. 4 is a high-level logical flowchart of a process for performing predicate selection in bit-level compositional transformations.

Referring now to FIG. 4, a high-level logical flowchart of a process for performing predicate selection in bit-level compositional transformations is depicted. The process starts at step 400, and then proceeds to step 402, which depicts predicate selection unit 160 selecting a seed value (r), wherein a set A=(r) and a set B is an empty set. The process next moves to step 404, which illustrates predicate selection unit 160 setting set B equal to the sum of its current contents and {fanout(A)−fanin(A)}, wherein fanin (R) returns registers in the combinational fanin of nodes in R and their next state functions (if any) and fanout (R) returns registers in the fanout of nodes in R.

The process then proceeds to step 406. Step 406 depicts predicate selection unit 160 creating a set C and setting set C={fanin(B)−fanout(B)}. The process next moves to step 408, which illustrates predicate selection unit 160 determining whether C+A==A is true. If predicate selection unit 160 determines that C+A==A is not true, then the process proceeds to step 410. Step 410 depicts predicate selection unit 160 setting set A equal to the sum of the current contents A added to the content of set C. The process then returns to step 402, which is described above.

Returning to step 408, predicate selection unit 160 determines that C+A==A is true, then the process proceeds to step 412, which illustrates predicate selection unit 160 setting $V_0$=s−t mincut(A,B), wherein t mincut(A,B) finds a minimal set of predicates between a component (containing A) and the logic this component fans out to (bordered by B). The process then ends at step 414.

Figure 5:
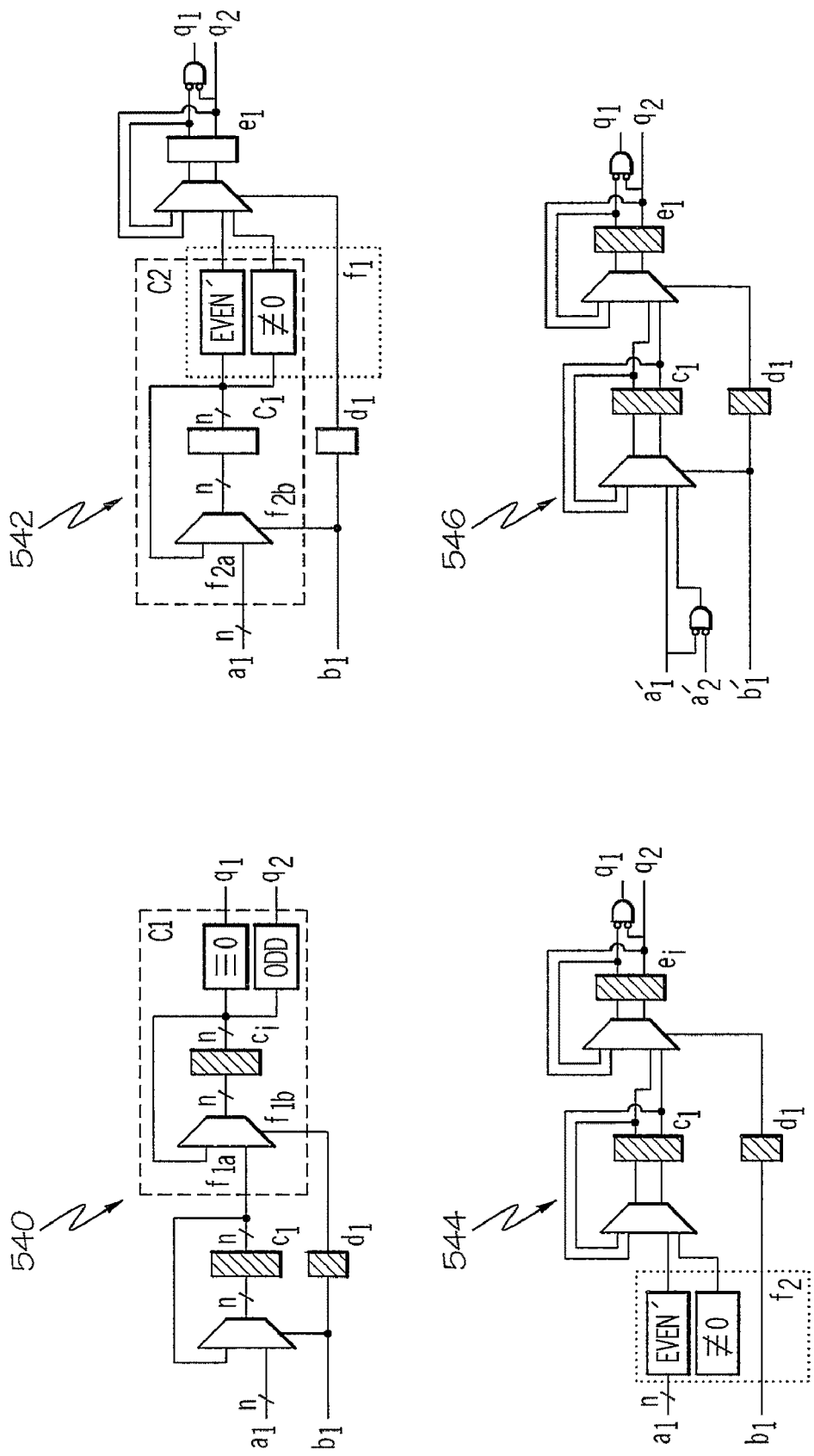
FIG. 5 is a series of example netlists illustrating the results of a process for predicate-based compositional minimization depicted in FIG. 3, in accordance with the preferred embodiment of the present invention.

Turning now to FIG. 5, a series of example netlists illustrating the results of a process for predicate-based compositional minimization depicted in FIG. 3, in accordance with the preferred embodiment of the present invention, is depicted. The operation of compositional minimization module 138 upon an example base netlist 540 illustrates the method and results of the present invention. Example base netlist 540 has an n-bit input 152 vector $<a_1, \ldots, a_n>$ and a single-bit input 152 $b_1$, corresponding to data and control, respectively. An n-bit register 150 vector $<c_1, \ldots, c_n>$ updates with data $a_i$ when $b_1$=1, else holds its current value. The control input 152 is pipelined through register 150 $d$. When $d_1$=1, the n-bit register 150 vector $<e_1, \ldots, e_n>$ updates with the contents of $c_i$, else it holds its current value. The contents of $e_i$ drive two output 154 predicate gates $q_1$ and $q_2$. Gate $q_1$ evaluates to a 1 if and only if $e_i$ is all zeros. Gate $q_2$ evaluates to a 1 IFF $e_i$ has odd parity.

Assuming that compositional minimization module 138 first abstracts component C1 of example base netlist 540. Compositional minimization module 138 computes output-equivalent states Eq, which consist of four disjoint sets of states: {$e_1$ is even and nonzero} when $<q_1, q_2>$=00; {$e_i$ is odd} when $<q_1, q_2>$=01; {$e_i$ is zero} when $<q_1, q_2>$=10; and 0 when {$q_1, q_2$}=11. Compositional minimization module 138 computes the image-equivalent states $E_T$ as the set of all states since the pseudo-inputs $f_{1a}$ and $f_{1b}$ induced by the isolation of C1 enable transitioning $e_i$ to all possible states. Compositional minimization module 138 computes the output and image equivalent (OIE) states $E_{qT}$ as the pairwise intersection of these two sets, equivalent in this case to $E_q$. Compositional minimization module 138 uses this data to compute an equivalence class on the set of input 152 valuations on a per-state basis. In particular, for every state s, compositional minimization module 138 computes the set of all input 152 valuations which transition each partition of OIE states. Compositional minimization module 138 then arbitrarily selects a representative $i_0$ from each of these equivalence classes, and forms a new transition relation. Finally, compositional minimization module 138 synthesizes this relation, and injects the resulting filter logic onto the inputs $f_{1a}$ and $f_{1b}$ of this component.

This structural transformation of example base netlist 540 by compositional minimization module 138 restricts the component's visibility of its original inputs 152 to the selected representatives from the equivalence classes thereof, in a way which preserves bisimilarity. It is noteworthy that—without component extraction—the set of image-equivalent states of example base netlist 540 would be partitioned to the extent that no data reductions would be possible (though $b_1$ may be tied to a 1, as is also possible for component C1). Additionally, it is noteworthy that this abstraction is capable of yielding reductions to more complex netlists, e.g., with data transformations and more complex control logic, even along the feedback paths. The chosen example is simple for clarity of exposition.

Assume that compositional minimization module 138 selects input 152 valuations $f_{1a}$=0 . . . 011 to preserve transitions to the OIE set where $<q_1, q_2>$=00; $f_{1a}$=0 . . . 01 to preserve transitions to the OIE set where $<q_1, q_2>$=01; and $f_{1a}$=0 . . . 0 to preserve transitions to the OIE set where $<q_1, q_2>$=10.

In first intermediate netlist 542, the resulting abstracted netlist is depicted. Logic $f_1$ represents the input filter injected by the abstraction. Predicate Even refers to a check of nonzero yet even parity. Compositional minimization module 138 additionally has deployed redundancy removal within first intermediate netlist 542 to propagate the input 152 filtering through the downstream logic. Because the filtering mapped all but the two least-significant bits of inputs $f_1$ at 0, compositional minimization module 138 reduced the component from n to 2 registers 150. Compositional minimization module 138 additionally simplified the logic driving $q_2$. Note that this transformation is similar to an architectural retiming of the output 154 predicates across the memory bank $e_i$. This is a transformation which classical netlist-based retiming and resynthesis cannot achieve due to the placement of the feedback cycles, illustrating how compositional minimization module 138 subsumes certain retiming and resynthesis moves.

Compositional minimization module 138 next abstracts component C2 of first intermediate netlist 542. Compositional minimization module 138 carries out this abstraction similarly to that of C1, and after redundancy removal yields the second intermediate netlist 544, reducing i from n to 2 registers 150. Finally, compositional minimization module 138 will reparameterize the input space of second intermediate netlist 544, to reduce $a_i$ from n to 2 inputs 152, as depicted in final netlist 546. While abstraction of component inputs 152 by compositional minimization module 138 is generally performed by insertion of filter logic (which does not reduce input count), in the special case that a component input 152 is a true netlist input 152 versus a pseudo-input induced by the partitioning, compositional minimization module 138 quantifies that input 152 and reparameterizes the i' relation. Note that this overall abstraction correlates to an optimal datapath reduction.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of machine-readable media utilized to actually carry out the distribution. Examples of machine-readable media include, without limitation, storage media, such as floppy disks or CD ROMs, and transmission type media, such as analog or digital communication links.

What is claimed is:

1. A method in data processing system, said method comprising:
    selecting a first set containing a seed register;
    adding to a second set a result of a subtraction of a fanout of said first set from a fanin of said first set;
    setting a third set equal to a result of a subtraction of a fanin of said second set from a fanout of said second set;
    determining whether a combination of said first set and said third set is equivalent to said first set; and
    in response to determining that said combination of said first set and said second set is not equivalent to said first set, returning a min-cut of said first set and said second set containing a minimal set of predicates between a first component and the logic to which said component fans out, wherein said logic is bordered by said second set.

2. The method of claim 1, further comprising the step of, in response to determining that said combination of said first set and said second set is not equivalent to said first set, adding to said first set the content of said third set.

3. The method of claim 1, further comprising:
    importing a design netlist containing one or more components;
    computing one or more output functions for said one or more components;
    generating one or more output equivalent state sets from said one or more output functions;
    identifying one or more next-state functions for said one or more components;
    producing one or more image equivalent state sets for said one or more next-state functions;
    classifying one or more output-and-image equivalent state sets for said one or more image equivalent state sets and said one or more output equivalent state sets;
    selecting one or more input representatives of said one or more equivalent input sets;
    forming an input map from said one or more input representatives;
    synthesizing said input map; and
    injecting said input map back into said netlist to generate a modified netlist.

4. The method of claim 3, further comprising the step of partitioning over one or more original states of said one or more components and one or more equivalence class inputs of said one or more components.

5. The method of claim 3, further comprising the step of getting a preimage from said one or more next state functions and said one or more output-and-image equivalent states to generate a preimage of said one or more output-and-image equivalent states.

6. The method of claim 5, wherein said step of producing one or more image equivalent states for said one or more next-state functions and said step of getting a preimage from said one or more next state functions and said one or more output-and-image equivalent states to generate said preimage of said one or more output-and-image equivalent states are performed in parallel.

7. The method of claim 5, further comprising the step of performing verification of said modified netlist.

8. A data processing system, said data processing system comprising:
    a processor;
    data storage; and
    program code, stored within the data storage, that when processed by the processor causes the data processing system to perform:
        selecting a first set containing a seed register;
        adding to a second set a result of a subtraction of a fanout of said first set from a fanin of said first set;
        setting a third set equal to a result of a subtraction of a fanin of said second set from a fanout of said second set;
        determining whether a combination of said first set and said third set is equivalent to said first set; and
        in response to determining that said combination of said first set and said second set is not equivalent to said first set, returning a min-cut of said first set and said second set containing a minimal set of predicates between a first component and the logic to which said component fans out, wherein said logic is bordered by said second set.

9. The data processing system of claim 8, wherein the program code further causes the data processing system to perform:
    in response to determining that said combination of said first set and said second set is not equivalent to said first set, adding to said first set the content of said third set.

10. The data processing system of claim 8, wherein the program code further causes the data processing system to perform:
    importing a design netlist containing one or more components;
    computing one or more output functions for said one or more components;
    generating one or more output equivalent state sets from said one or more output functions;
    identifying one or more next-state functions for said one or more components;
    producing one or more image equivalent state sets for said one or more next-state functions;
    classifying one or more output-and-image equivalent state sets for said one or more image equivalent state sets and said one or more output equivalent state sets;
    selecting one or more input representatives of said one or more equivalent input sets;
    forming an input map from said one or more input representatives;
    synthesizing said input map; and
    injecting said input map back into said netlist to generate a modified netlist.

11. The data processing system of claim 10, wherein the program code further causes the data processing system to perform:
    partitioning over one or more original states of said one or more components and one or more equivalence class inputs of said one or more components.

12. The data processing system of claim 10, wherein the program code further causes the data processing system to perform:
    getting a preimage from said one or more next state functions and said one or more output-and-image equivalent states to generate a preimage of said one or more output-and-image equivalent states.

13. The data processing system of claim 12, wherein said producing one or more image equivalent states for said one or more next-state functions and said getting a preimage from said one or more next state functions and said one or more output-and-image equivalent states to generate said preimage of said one or more output-and-image equivalent states are performed in parallel.

14. The data processing system of claim 12, wherein the program code further causes the data processing system to perform:
    performing verification of said modified netlist.

15. A tangible machine-readable storage medium having a plurality of instructions processable by a machine stored therein, wherein said plurality of instructions, when processed by said machine, causes said machine to perform:
    selecting a first set containing a seed register;
    adding to a second set a result of a subtraction of a fanout of said first set from a fanin of said first set;
    setting a third set equal to a result of a subtraction of a fanin of said second set from a fanout of said second set;
    determining whether a combination of said first set and said third set is equivalent to said first set; and
    in response to determining that said combination of said first set and said second set is not equivalent to said first set, returning a min-cut of said first set and said second set containing a minimal set of predicates between a first component and the logic to which said component fans out, wherein said logic is bordered by said second set.

16. The machine-readable storage medium of claim 15, wherein said plurality of instructions further causes the machine to perform:
    in response to determining that said combination of said first set and said second set is not equivalent to said first set, adding to said first set the content of said third set.

17. The machine-readable storage medium of claim 15, wherein said plurality of instructions further causes the machine to perform:
    importing a design netlist containing one or more components;
    computing one or more output functions for said one or more components;
    generating one or more output equivalent state sets from said one or more output functions;
    identifying one or more next-state functions for said one or more components;
    producing one or more image equivalent state sets for said one or more next-state functions;
    classifying one or more output-and-image equivalent state sets for said one or more image equivalent state sets and said one or more output equivalent state sets;
    selecting one or more input representatives of said one or more equivalent input sets;
    forming an input map from said one or more input representatives;
    synthesizing said input map; and
    injecting said input map back into said netlist to generate a modified netlist.

18. The machine-readable storage medium of claim 17, wherein said plurality of instructions further causes the machine to perform:
    partitioning over one or more original states of said one or more components and one or more equivalence class inputs of said one or more components.

19. The machine-readable storage medium of claim 17, wherein said plurality of instructions further causes the machine to perform:
    getting a preimage from said one or more next state functions and said one or more output-and-image equivalent states to generate a preimage of said one or more output-and-image equivalent states.

20. The machine-readable storage medium of claim 19, wherein said producing one or more image equivalent states for said one or more next-state functions and said getting a preimage from said one or more next state functions and said one or more output-and-image equivalent states to generate said preimage of said one or more output-and-image equivalent states are performed in parallel.

* * * * *